US006693985B2

(12) United States Patent
Li et al.

(10) Patent No.: US 6,693,985 B2
(45) Date of Patent: Feb. 17, 2004

(54) CLOCK AND DATA RECOVERY METHOD AND APPARATUS

(75) Inventors: Hung Sung Li, Sunnyvale, CA (US); Ook Kim, Palo Alto, CA (US)

(73) Assignee: Silicon Image, Sunnyvale, CA (US)

( * ) Notice: Subject to any disclaimer, the term of this patent is extended or adjusted under 35 U.S.C. 154(b) by 0 days.

(21) Appl. No.: 10/043,886

(22) Filed: Oct. 26, 2001

(65) Prior Publication Data

US 2002/0131539 A1 Sep. 19, 2002

Related U.S. Application Data

(60) Provisional application No. 60/243,855, filed on Oct. 27, 2000.

(51) Int. Cl.[7] .................................................. H04L 7/00
(52) U.S. Cl. ........................ 375/355; 375/371; 327/144
(58) Field of Search .............................. 375/354, 355, 375/371, 373, 376; 327/144, 145, 152, 153, 161

(56) References Cited

U.S. PATENT DOCUMENTS

| 4,821,297 A | * | 4/1989 | Bergmann et al. .......... 375/376 |
| 5,668,830 A | * | 9/1997 | Georgiou et al. ........... 375/220 |
| 6,366,145 B1 | * | 4/2002 | Williams et al. ............ 327/156 |
| 2002/0079938 | * | 6/2002 | Sacki |

FOREIGN PATENT DOCUMENTS

EP 0317159 5/1989

OTHER PUBLICATIONS

Yang, Chih–Kong Ken et al., "A 0.6 μm CMOS 4Gb/s Transceiver with Data Recovery Using Oversampling," Center for Intergrated Systems, Stanford University, 1997 Symposium on VLSI Circuits Digest of Technical Papers (pp. 71–72).

Kang, Jin–Ku et al., "A CMOS High–Speed Data Recovery Circuit Using the Matched Delay Sampling Technique," IEEE Journal of Solid–State Circuits, Vol. 32, No. 10, Oct. 1997 (pp. 1588–1596).

Lee, Kyeongho et al., "High Speed Low EMI Digital Video Interface with Cable Deskewing and Transition Minimization Coding", Inter–University Semiconductor Research Center, Seoul National University, Seoul, Korea, 1997 Symposium on VLSI Circuits Digest of Technical Papers (pp. 33–34).

International Search Report for International Application No. PCT/US01/50149 dated Apr. 23, 2002.

* cited by examiner

*Primary Examiner*—Young T. Tse
(74) *Attorney, Agent, or Firm*—Perkins Coie LLP (57) ABSTRACT

Embodiments of a clock and data recovery method and apparatus include receiving a multi-channel serial digitally encoded signal and converting the received signal to digital data, or set of binary characters. One embodiment includes determining whether a phase of a sampling circuit is appropriate to sample meaningful data from a received signal; if the phase of the sampling circuit is not appropriate, the phase is shifted so that sampling occurs earlier or later for the received signal. The determination is based, in one embodiment, on the order and value of the samples taken, which indicate whether the samples are taken too close to a transition of the received signal.

19 Claims, 7 Drawing Sheets

CLOCK AND DATA RECOVERY METHOD AND APPARATUS

RELATED APPLICATIONS

This application claims priority from U.S. Provisional Patent Application Serial No. 60/243,855, titled Clock and Data Recovery Scheme Using Multiple-Phase Clocks and a Barrel Shifter, filed Oct. 27, 2000, which is incorporated herein by reference.

TECHNICAL FIELD

Embodiments of the invention are in the field of processing high-speed digitally encoded analog data.

DESCRIPTION OF THE BACKGROUND

When performing parallel sampling of a serial data stream, clock skew must be compensated for. Clock skew occurs when there is a difference in clock signal timing between the signal being sampled and the sampling circuit. Clock skew can cause the sampling circuit to sample the signal at times during which the received signal does not represent meaningful data. Bit error rate ("BER") is a measure of transmission errors, typically the number of erroneous data bits over the total number of bits transmitted. In most systems, there is a maximum BER that cannot be tolerated.

In serially transmitted binary data, one way to extract original data is to sample more bits during one bit period. This technique is called oversampling. From oversampled data, the receiver can extract the best samples with minimum error, due to nearby data and clock information. Oversampling includes sampling multiple times in a period of time during which the received signal is expected to represent meaningful data. The multiple samples collected, however, include bad samples and good samples, and the bad samples must be discarded. In some prior circuits that perform oversampling, the received signal frequency is too high for a single sampling circuit to perform the required number of sampling operations per time period. Therefore, several parallel sampling circuits are used. Each of the sampling circuits is "fired" by a clock signal with a distinct point in time, so the sampling circuits are fired in sequence. For example, an oversampling ratio of 4 implies that 4 data samples are to be sampled per bit time period. If there are 16 parallel sampling circuits which sample input data based on clock data, 16 equally spaced clock phases are required. This proliferation of clocks can be expensive in hardware and power, and the majority of the samples collected are not actually used for extracting transmitted data samples.

DETAILED DESCRIPTION

The invention will now be described with respect to various embodiments. The following description provides specific details for a thorough understanding of, and enabling description for, these embodiments of the invention. However, one skilled in the art will understand that the invention may be practiced without these details. In other instances, well known structures and functions have not been shown or described in detail to avoid unnecessarily obscuring the description of the embodiments of the invention. For each embodiment, the same reference numbers and acronyms identify elements or acts with the same or similar functionality for ease of understanding and convenience.

A clock and data recovery method and apparatus described herein is applicable to various types of data transmission. Embodiments include a method and apparatus for receiving a multi-channel serial digitally encoded signal and converting the received signal to digital data, or a set of binary characters. One embodiment includes determining whether a phase of a sampling circuit is appropriate to sample meaningful data from a received signal. If it is determined that the phase of the sampling circuit is not appropriate, the phase is shifted so that sampling occurs sooner or later in relationship to the received signal. The determination is based, in one embodiment, on the order and value of the samples taken, which indicate whether the samples are taken too close to a transition of the received signal. Determining an appropriate sampling phase allows fewer samples to be taken and therefore fewer sampling circuits to be used without corresponding degradation in sampling resolution. This can be illustrated as follows.

Let B=bit rate in samples/second, and

OS=oversampling ratio, that is, the received signal is sampled at OS times the frequency of the transmitted data rate.

If N=the number of parallel sampling circuits. The sampling frequency per sampling circuit is $(B \times OS)/N$. If N sampling clock phases are further divided by X phases, then the total number of phases becomes $N \cdot X$. If each of N sampling circuits may receive one of N clock phases (that is, each sampling circuit is supplied with a phase clock among N clock phases) then the sampling resolution is $1/B \cdot OS \cdot X$, and the effective sampling frequency per sampling circuit becomes $B \cdot OS \cdot X$. According to embodiments of the invention, the effective sampling frequency is further increased without increasing the number of sampling circuits. This is because each N phase clock has a resolution of $1/B \cdot OS \cdot X$. In one embodiment, N is four, X is four, so that each phase of a four phase clock has a resolution of four phases. The sampling points are intelligently chosen, which allows four of the sixteen available phases to be used instead of using all sixteen phases.

One embodiment uses four generated clock signals to produce sixteen sampling clock phases from which to choose. The sixteen sampling clock phases are evenly distributed about 360 degrees. The four generated clock signals actually chosen to drive the four sampling circuits have phase increments of 90 degrees. There are sixteen possible sets of four clock signals that can be chosen. The sampled signals are evaluated to intelligently determine whether the sampling circuits are sufficiently in phase with the received signal. The evaluation also indicates whether to adjust the sampling circuit phases to occur sooner or later. The effective sampling resolution is thus greater than the actual sampling resolution. For example, in the case just described, the actual sampling resolution is four, but the quality of the converted signal, as reflected for example in the BER of the converted signal, is comparable to the quality achieved with sampling resolution of sixteen.

Figure 1:
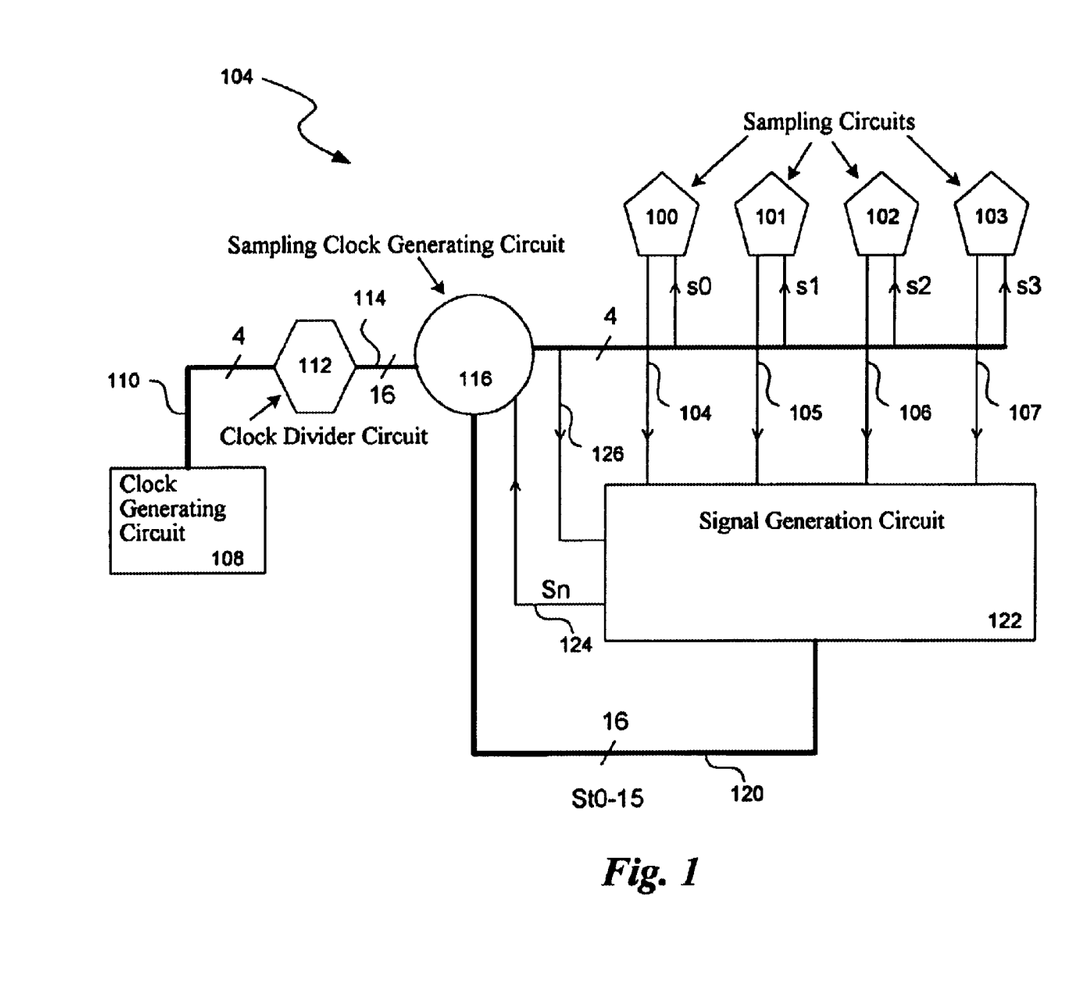
FIG. 1 is block diagram of an embodiment of a clock and data recovery circuit.

In the FIG. 1 block diagram, an embodiment of a clock and data recovery circuit 104 provides sampling of a digitally encoded signal with a sampling resolution greater than the oversampling ratio. The circuit 104 includes four sampling circuits 100, 101, 102, and 103. The sampling circuits 100–103 are any one of several known circuits for collecting samples of a signal over time or periodically for the purpose of reconstructing or processing the signal. In one embodiment, the sampling circuits 100–103 are arranged in parallel to sample a digitally encoded analog signal and accurately produce digital data from the signal. The sampling circuits are each clocked separately by a respective sampling clock signal s0, s1, s2, and s3, with each having a different phase. The sampling clock signals s0–s3 each activate a respective sampling circuit 100–103 to collect a sample of the received signal. The value of the signals and their order of occurrence determine the encoding of the received signal. In one embodiment, the received signal has different voltage values that determine a data value, such as 1, 0. When the received signal makes a transition from one voltage to another, the signal crosses a transition point at which samples are contaminated by noise and nearby data values. It is therefore important to synchronize the sampling clock signals to the received data so that samples of meaningful data are taken because they represent no meaningful data encoded in the signal. The synchronization of the sampling clock signals is discussed in more detail below.

A clock generating circuit 108 generates four clock signals 110 that each have different phases. In one embodiment, the four clock signals 110 are 90 degrees out of phase with their closest neighbors so that the four clock phases are equally distributed about 360 degrees. In one embodiment, the clock generating circuit 108 is an analog phase locked loop (PLL), although other embodiments may employ other clock generating circuits such as a delay lock loop (DLL), multiple clocks (e.g., oscillators) or a single clock with delay elements. A clock divider circuit 112 receives the four clock signals 110 and creates sixteen clock signals 114 from the four clock signals. The clock divider circuit 112 is a known circuit, such as in one embodiment, a multi-phase interpolator circuit. In another embodiment, the clock divider circuit 112 is a resistor network. In yet another embodiment, the clock divider circuit 112 is a circuit including voltage controlled oscillator (VCO) delay elements.

The sixteen clock signals 114 each have the same frequency and are synchronized, but each have a unique phase such that the sixteen phases are equally distributed about 360 degrees. A sampling clock generating circuit 116 receives the sixteen clock signals 114 and generates in response the four sampling clock signals s0, s1, s2, and s3 as will be more fully described.

A switching signal generation circuit 122 generates a control signal 120 and provides it to the sampling clock signal generating circuit 116. The control signal 120 determines which of the sixteen clock signals 114 the sampling clock generating circuit 116 generates as the four sampling clock signals s0–s3. The control signal 120 are composed of sixteen signals st0–st15, and only one is active at one time. The control signal generating circuit 122 activates a particular control signal 120 after determining whether the sampling circuits 100–103 are sufficiently in phase with the received signal so as to sample effectively and allow meaningful data to be recovered from the received signal. The switching signal generating circuit 122 receives and evaluates sampled data signals 104, 105, 106, and 107 to determine whether sampling phases of the sampling circuits 100–103 as dictated by the sampling clock signals s0–s3 must be shifted. (The signals (e.g., s0–s3, 104–107, etc.) are shown as lines between blocks in FIG. 1.) The control signal generating circuit 122 further receives the sampling clock signals 126 to control signal generating logic. In one embodiment, the control signal generating circuit 122 includes a digital clock and data recovery (CDR). The control signal generating circuit 122 transmits a latching clock signal 124 to synchronize logic in the sampling clock generating circuit 116. The logic in the sampling clock generating circuit 116 must be synchronized, as discussed below, so that when the sampling clock signals s0–s3 are shifted, no clock skew effects occur in the sampling clock signals s0–s3 due to the fact that shifting the phases of the sampling clock signals s0–s3 includes switching clock sources.

Figure 2A:
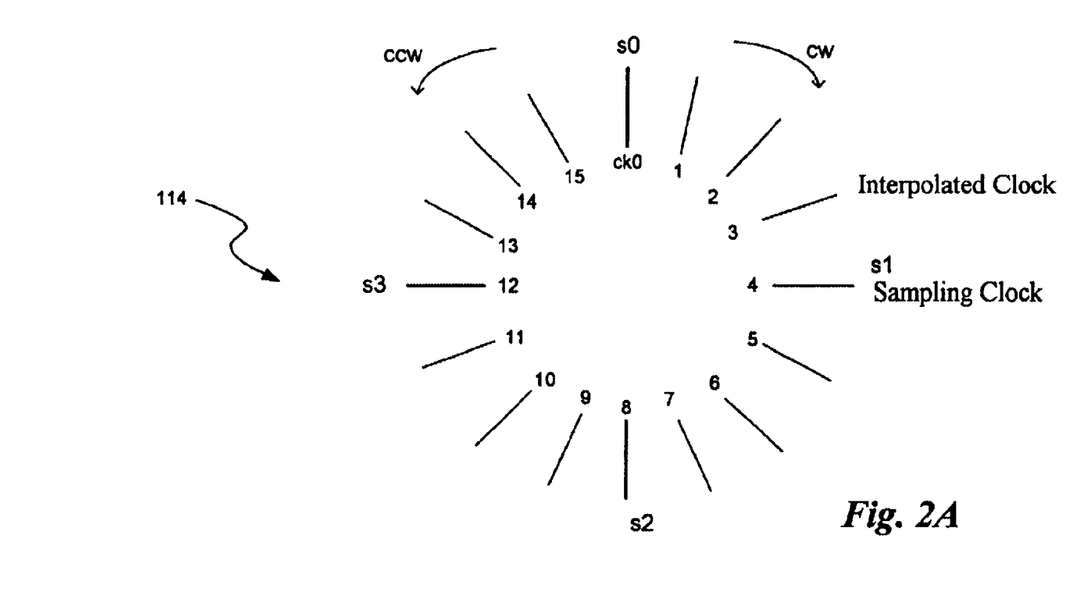
FIG. 2A is a diagram illustrating sixteen clock signals and their relative phases.
Figure 2B:
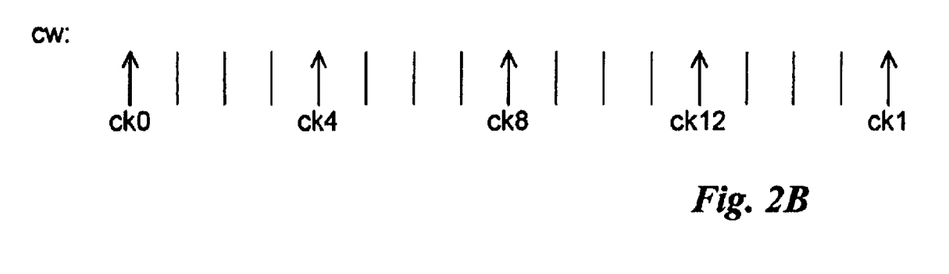
FIG. 2B illustrates the order and frequency of sampling circuits "firing" in the embodiment of FIG. 1.

FIG. 2A is a diagram illustrating the sixteen clock signals 114 labeled ck0, 1, 2, etc., and their relative phases. The sixteen clock signals 114 are separated by uniform phase increments about 360 degrees (i.e., 22.5 degrees apart). The four sampling clock signals s0–s3, in this example, are ck0, ck4, ck8, and ck12. The four sampling clock signals s0–s3 are separated by 90 degree increments. FIG. 2B shows the order and frequency of the sampling circuits s0–s3 "firing". The first sampling clock signal, s1, is ck0 in this example. The second sampling clock signal, s1, is ck4, and so on. When the switching signal generating circuit 122 determines that the phases of the sampling clock signals s0–s3 are offset from the optimum center of the received signal, a control signal 120 is generated to shift the phases of the sampling clock signals s0–s3 forward one phase increment. This is illustrated in FIG. 2B, which shows that after s3 (which is ck12) occurs, the next s0 is ck1. A phase shift of one increment "late" or clockwise has occurred. After the shift, s1 is ck5, s2 is ck9, and s3 is ck13. The occurrence of ck1 (the "new" s0) is delayed one phase increment, as shown, to provide consistent sampling clock signals s0–s3 to the sampling clock circuits 100–103. When the switching signal generating circuit 122 determines that the phases of the sampling clock signals s0–s3 are too far ahead of the received signal, it generates a control signal 120 to shift the phases of the sampling clock signals s0–s3 back one phase increment in a manner corresponding to the illustrated example of a shift forward. For example, s0 becomes ck15, and so on.

Figure 3:
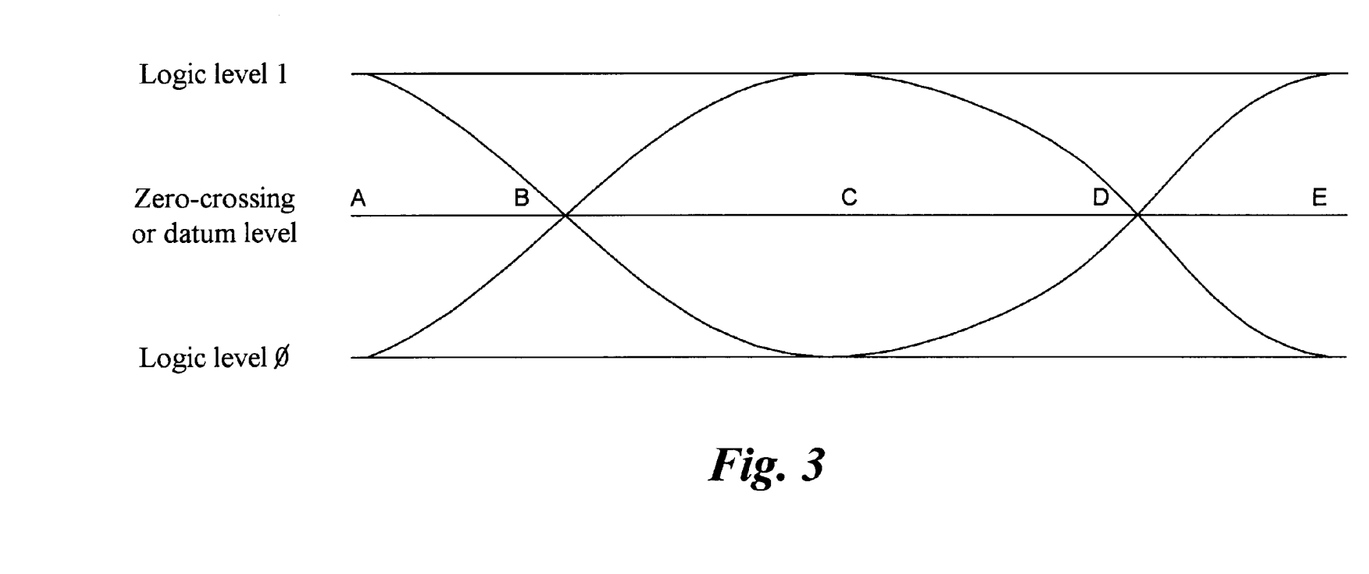
FIG. 3 illustrates a sampling operation in the embodiment of FIG. 1.

The switching signal generating circuit 122, in one embodiment, executes an algorithm to determine whether the sampling circuits 100–103 are sufficiently in phase with the received signal. FIG. 3 illustrates sampling in one embodiment. A waveform of the received data signal is shown along with logic values represented by different signal levels. A highest positive signal level represents a logic 1, and a lowest negative signal level represents a logic level 0. Times A, B, C, D, and E are times at which samples are taken, or sample points. "Midbit" samples a, c, and e are taken at times A, C, and E. "Transition" samples b and d are taken at times B and D, which are close to signal transitions of the zero-crossing. The switching signal generating circuit 122 evaluates samples 104–107 to determine at which times the samples were taken. In one embodiment, the switching signal generating circuit 122 determines whether the phases of the sampling circuits 100–103 are early or late as follows.

1) If a equals b and b does not equal c, sampling is late
2) If a does not equal b and b equals c, sampling is early
3) If a equals b equals c, no decision is possible
4) If a equals c and c does not equal b, no decision is possible In case 1, the switching signal generating circuit 122 generates a control signal 120 to change the sampling phases to an earlier phase. In case 2, the switching signal generating circuit 122 generates a control signal 120 to change the sampling phases to a later phase. In cases 3 and 4, no new control signal 120 is generated and the current control signal 120 remains active. When no decision is possible, the algorithm assumes that the sampling phases are effectively correct and that no changes are necessary. Those skilled in the relevant art will recognize that various circuits or systems may be employed in the switching signal generating circuit 122 to implement the algorithm (e.g., field programmable logic, an array of logic gates corresponding to logic rules, a programmed microcontroller, etc.). In other embodiments, other known algorithms or methods are used to determine whether the sampling circuits 100–103 are sufficiently synchronized.

Figure 4:
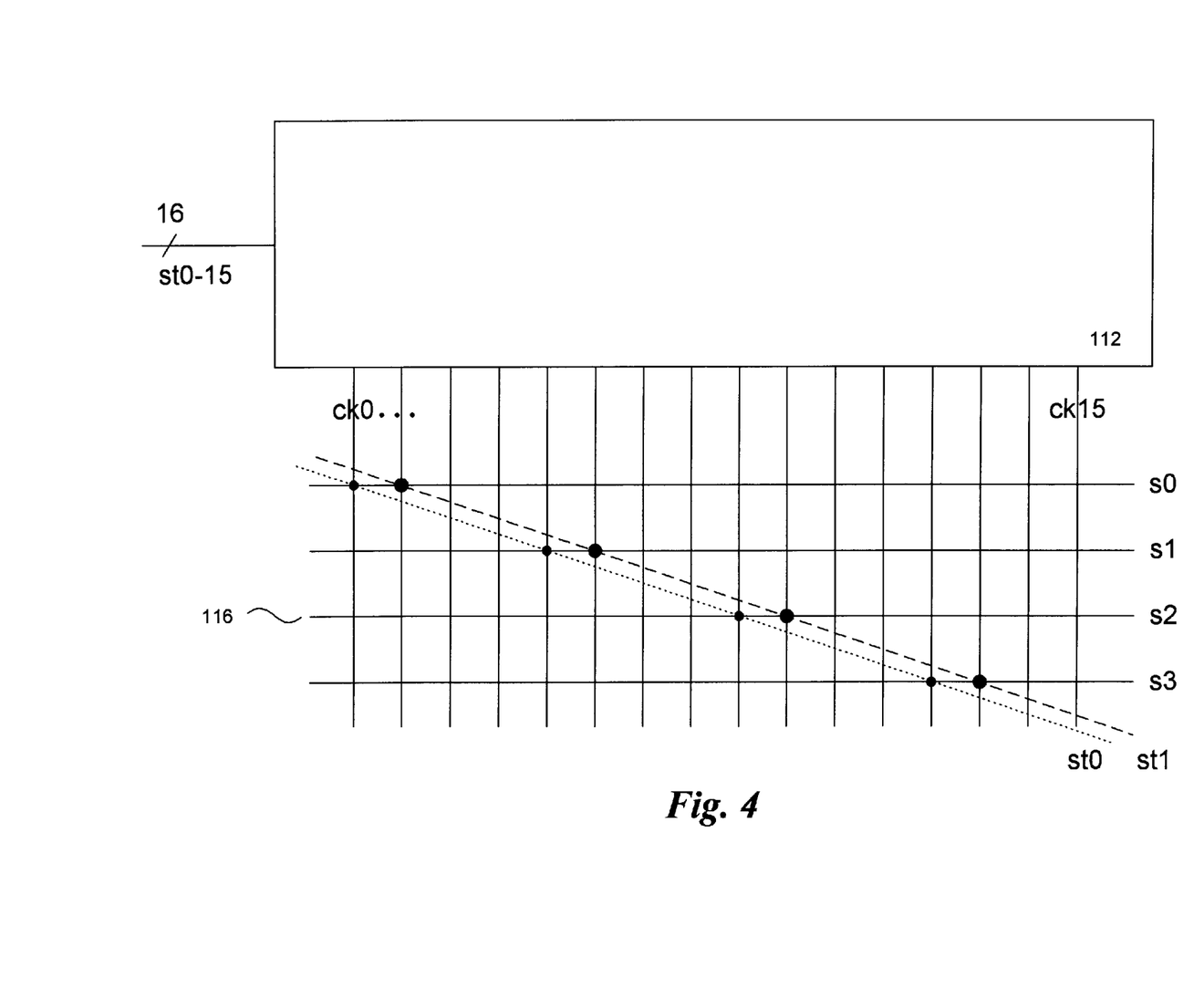
FIG. 4 is a simplified diagram of a switching matrix in one embodiment of a sampling clock generating circuit for use in the circuit of FIG. 1.

FIG. 4 is a simplified diagram of a switching matrix in one embodiment of the sampling clock generating circuit 116. In various embodiments, the sampling clock generation circuit can be a barrel shifter or any other logic circuit whose outputs can be shifted. As described herein, the switching signal generating circuit 122 effectively processes the four samples it receives from the four sampling clock circuits 100–103 to decide whether the phase of the clock should be moved forward or backward (e.g., clockwise or counter clockwise through control signals st0–st15 if a barrel shifter is employed as the sampling clock generating circuit 116). The clock divider circuit 112 includes sixteen outputs connected to the sampling clock signal generator circuit 116 for carrying sixteen clock signals ck0–ck15 as shown. The clock signals ck0–ck15 each have a distinct phase as illustrated in FIG. 2A. The ck0–ck15 outputs of the clock divider circuit 112 are each electrically connected to each of four sampling clock outputs that carry the sampling clock signals s0–s3 so as to form the matrix shown. The sampling clock generating circuit 116 receives an active control signal that determines which of the sixteen clock signals ck0–ck15 become the four sampling clock signals s0–s3. Two cases are shown in FIG. 4. In one case, the st0 signal is active. In this case, the switching matrix connects the ck0 output to the s0 output, the ck4 output to the s1 output, the ck8 output to the s2 output, and the ck12 output to the s3 output. In another case, the phases of the sampling clock signals s0–s3 are shifted forward one phase increment. Thus, the switching matrix connects the ck1 output to the s0 output, the ck5 output to the s1 output, the ck9 output to the s2 output, and the ck13 output to the s3 output. The other control signal lines, such as for control signals st2–st15, are not shown for clarity.

Figure 5:
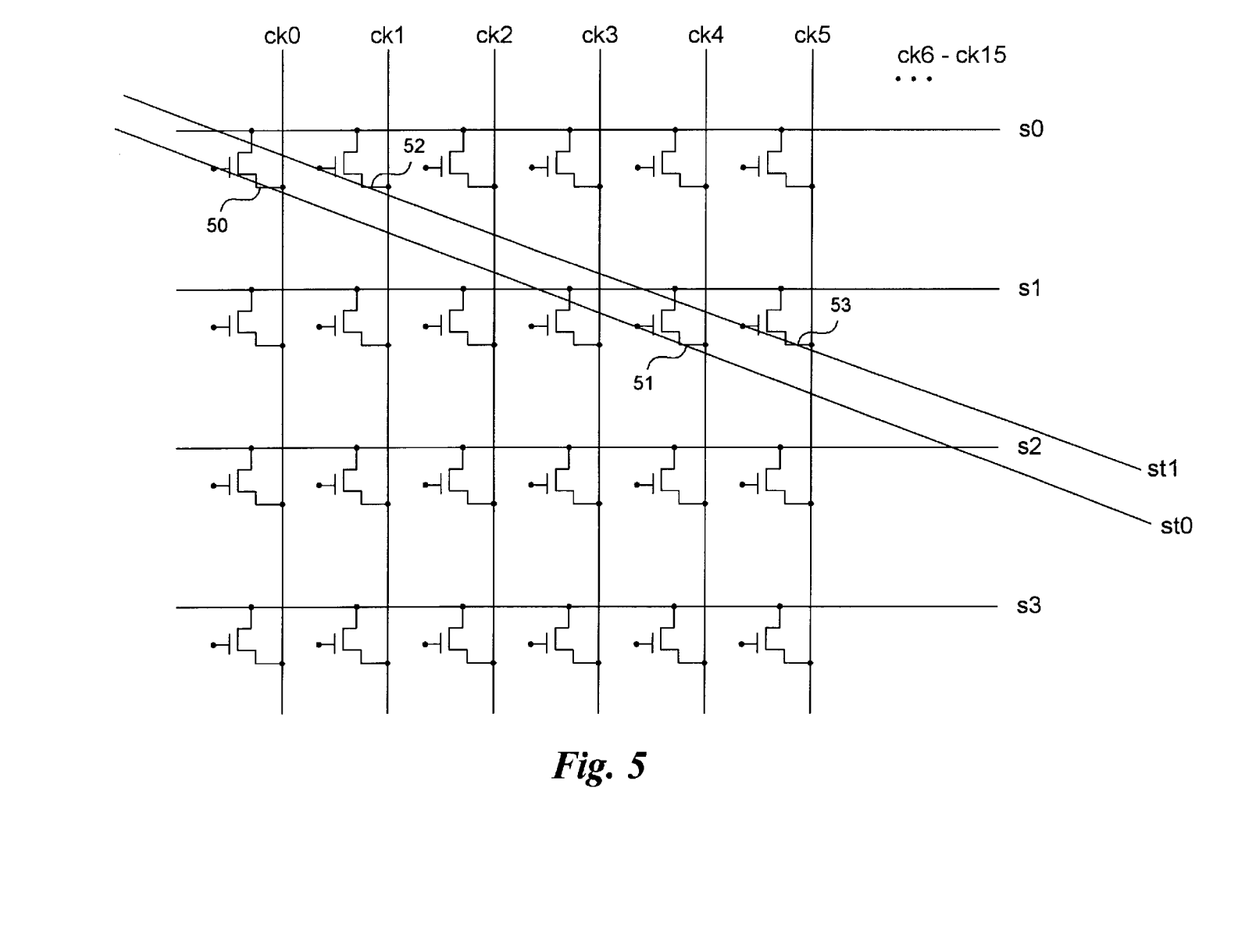
FIG. 5 is another diagram of the switching matrix of FIG. 4.

FIG. 5 is a diagram of the switching matrix of FIG. 4 in an embodiment that shows transistor switches at intersection points. The control signal lines for st0 and st1 are shown connected to the gates of transistor switches. For example, the control signal line for the control signal st0 is shown connected to the gates of transistor 50 and 51. When st0 is active, the transistors 50 and 51 are "on" and electrically connect the ck0 line with the s0 line, and the ck4 line with the s1 line. (While not shown in FIG. 5, st0 likewise activates two other transistors to electrically connect the ck8 and ck12 lines with the s2 and s3 lines, respectively.) Similarly, the st1 line is connected to the gates of transistors 52 and 53 (and other transistors not shown), so that when st1 is active, the ck1 line and the ck5 line are connected to the s0 and s1 lines, respectively. The other control signal lines st2–st15 and clock signal lines ck6–ck15 are not shown for clarity.

Figure 6:
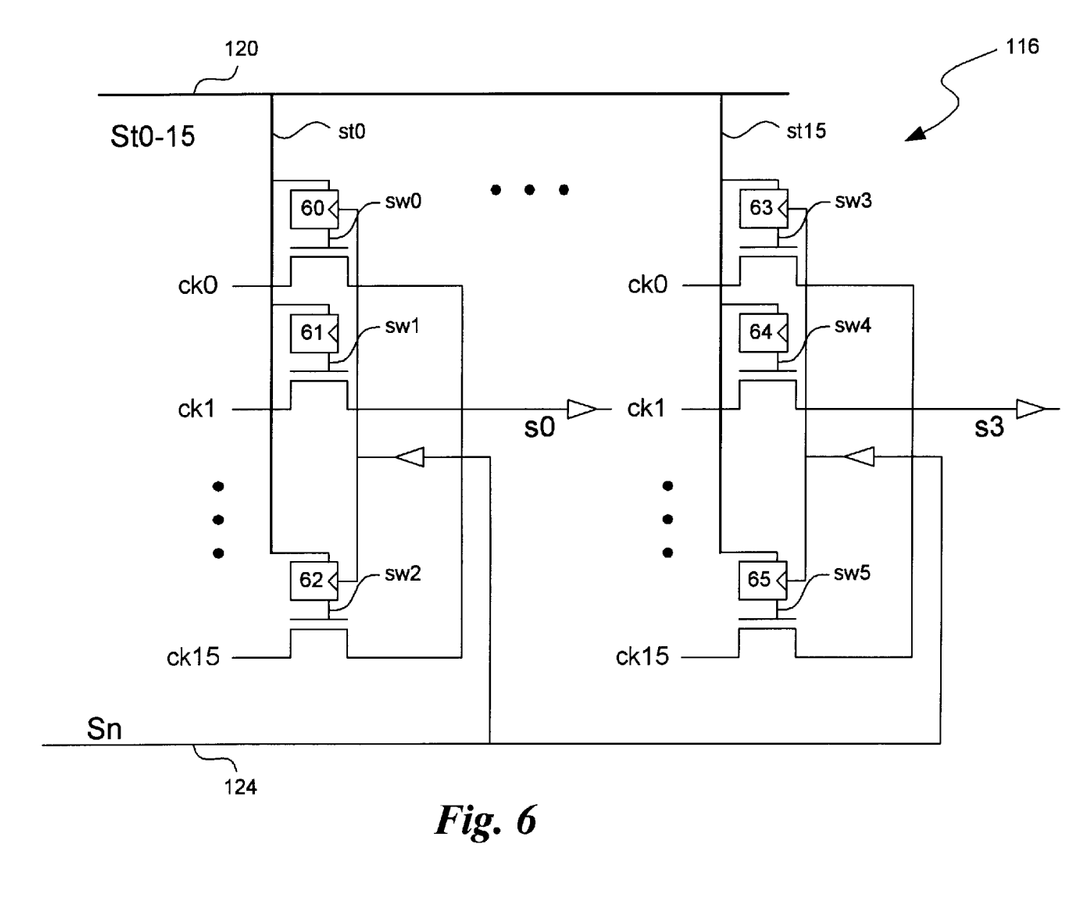
FIG. 6 is block diagram showing part of the switching matrix of FIG. 4.

FIG. 6 is block diagram showing part of the switching matrix of FIG. 4 at yet a further level of detail. The ck0–ck15 outputs of the clock divider circuit 112 are in effect candidate sources for the sampling clock signals s0–s3. As previously described, the phases of the sampling clock signals s0–s3 are shifted when it is determined that the sampling circuits 100–103 are not sufficiently synchronized with the received signal. This shifting involves switching sampling clock sources from one set of four of the ck0–ck15 outputs to another set of four. FIG. 6 illustrates latching circuitry that allows the sampling clock source switching to occur when the clocks are stable so that the s0–s3 outputs remain consistent. Flip-Flops (FFs) are used to latch the active control signal 120. The diagram is simplified so that only part of the st0 control signal line is shown, including the FFs 60, 61, and 62; intervening FFs are not show for simplicity. The FFs 60, 61 and 62 latch the st0 signal for the ck0 line, the ck1 line, and the ck15 line. Similarly, a corresponding portion of the st15 switching line is shown with FFs 63, 64, and 65. The st0 switching line will be discussed. Other portions of the switching matrix that correspond to the portion discussed operate similarly.

The outputs of the FFs 60–62 are each electrically connected to a transistor gate as shown. The FFs and transistors are clocked by a common clock signal 124, designated Sn, which is one of the sampling clock signals s0–s3. One of the s0–s3 signals is chosen to appropriately synchronize the switching operation according to its phase. For example, an appropriate phase for s1 is chosen to be Sn after simulation reveals that s2 is too late and s0 is too early, as described further below. The signals sw0–sw5 are latched, or synchronized switching signals that have been clocked through a FF by the Sn common FF clock signal. When st0 is active, and the Sn signal latches the st0 signal through the FF 60, the sw0 signal turns on the transistor connected to the FF 60 and allows the ck0 signal to generate or source the sampling clock signal s0.

Figure 7:
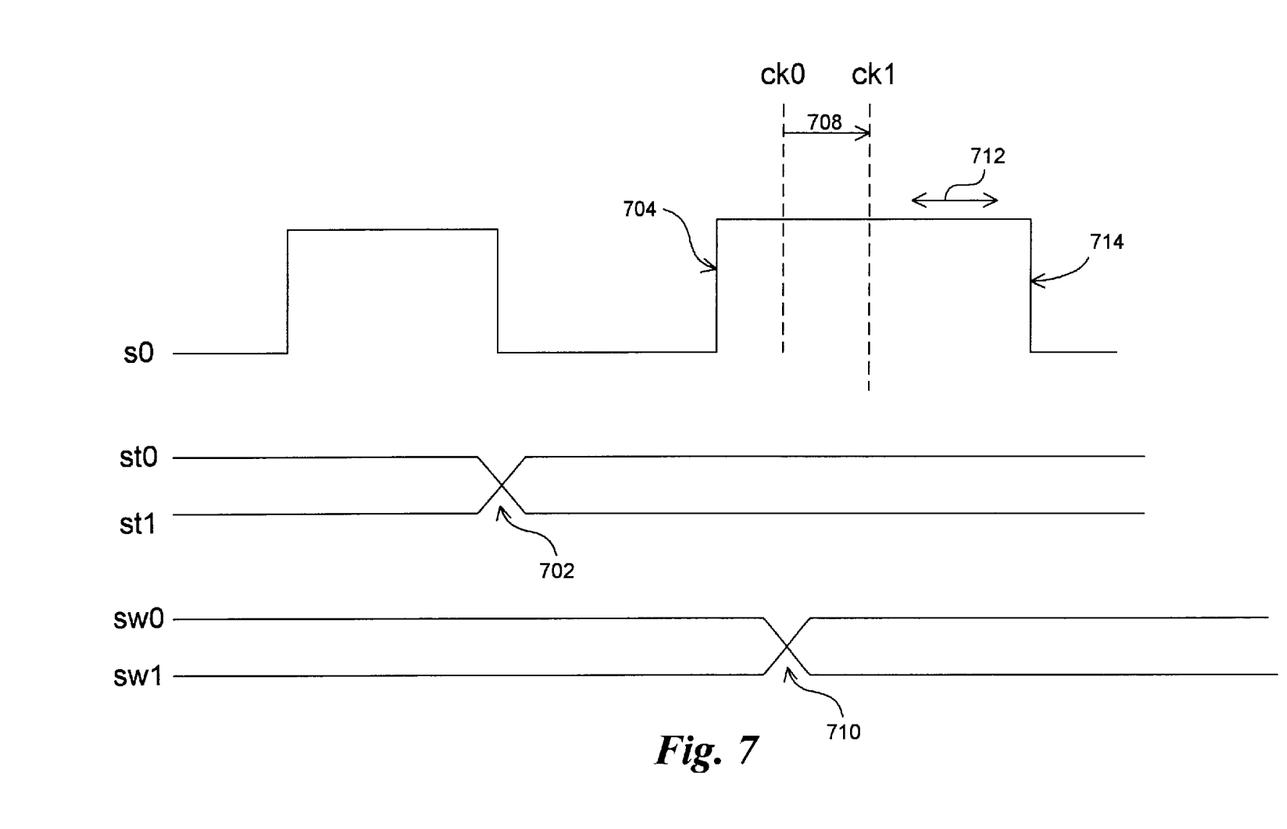
FIG. 7 is a timing diagram that illustrates the synchronization of a clock switching operation of the embodiment of FIG. 6.

FIG. 7 is a timing diagram that illustrates the synchronization of the clock switching operation further. FIG. 7 can be referred to along with FIG. 6. FIG. 7 illustrates a switch of clock source for the sampling clock signal s0 from ck0 to ck1. Initially, the source of the sampling clock signal s0 is ck0, but after the switching operation the source of the sampling clock signal s0 is ck1. In this example, the sampling clock signal s0 also serves as the common FF clock signal 124, or signal Sn. The control signals st0 and st1 are shown below the s0 signal. Latched switching signals sw0 and sw1 are shown below the control signals st0 and st1.

At transition time 702, the current active switching signal changes from st0 to st1. At rising edge 704 of the sampling clock signal s1, the st1 control signal is latched by the FF 60, causing the active latched sw signal to change from sw0 to sw1 at the transition time 710. This transition, as shown at 708, causes the clock source of the sampling clock signal s0 to change from ck0 to ck1. The change in clock source happens during a stable period of the s0 signal (in this case, a high signal period) so that no sampling clock disruption occurs. The falling edge 714 of s0 is extended as shown at 712, after the st0, st1 transition Thus, switching of clocks may be completed at the end of a clock cycle. Switching the clock signal lines within one clock cycle prevents disturbing operation of the sampling circuits 100–103. Before and after the switching operation just described, the other control signals st2–st15 are inactive.

In some instances, different sampling clock signals s0–s3 may be used to clock the FFs. It may happen, for example due to physical circuit particularities, that the s0 signal is too late or too early to serve as the common FF clock signal 124. This can be discovered during simulation or testing of the circuit. In that case, another of the sampling clock signals s0–s3 can be chosen to be the common FF clock signal 124.

Embodiments of the invention have been described with reference to particular examples. Many alternatives are possible under the invention described herein. For example, the number of sampling circuits could be more or less than four. Similarly, the number of clock phases provided by the clock divider could be more or less than sixteen. Other variations within the scope of the claimed invention include different circuits or methods for synchronizing the switching operation from one set of sampling clock signals to another.

Aspects of the invention may be implemented as functionality programmed into any of a variety of circuitry, including programmable logic devices (PLDs), such as field programmable gate arrays (FPGAs), programmable array logic (PAL) devices, electrically programmable logic and memory devices and standard cell-based devices, as well as application specific integrated circuits (ASICs). Some other possibilities for implementing aspects of the invention include: microcontrollers with memory (such as electronically erasable programmable read only memory (EEPROM)), embedded microprocessors, firmware, software, etc. If aspects of the invention are embodied as software at at least one stage during manufacturing (e.g. before being embedded in firmware or in a PLD), the software may be carried by any computer readable medium, such as magnetically- or optically-readable disks (fixed or floppy), modulated on a carrier signal or otherwise transmitted, etc. Furthermore, aspects of the invention may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), and polymer technologies.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "above," "below," and words of similar import, when used in this application, shall refer to this application as a whole and not to any particular portions of this application. When the claims use the word "or" in reference to a list of two or more items, that word covers all of the following interpretations of the word: any of the items in the list, all of the items in the list and any combination of the items in the list.

The above detailed descriptions of embodiments of the invention are not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while steps are presented in a given order, alternative embodiments may perform routines having steps in a different order. The teachings of the invention provided herein can be applied to other systems, not necessarily the system described herein. These and other changes can be made to the invention in light of the detailed description. The elements and acts of the various embodiments described above can be combined to provide further embodiments.

These and other changes can be made to the invention in light of the above detailed description. In general, the terms used in the following claims, should not be construed to limit the invention to the specific embodiments disclosed in the specification, unless the above detailed description explicitly defines such terms. Accordingly, the actual scope of the invention encompasses the disclosed embodiments and all equivalent ways of practicing or implementing the invention under the claims.

While certain aspects of the invention are presented below in certain claim forms, the inventors contemplate the various aspects of the invention in any number of claim forms. For example, while only one aspect of the invention is recited as embodied in a semiconductor chip, other aspects may likewise be embodied in a chip. Accordingly, the inventors reserve the right to add additional claims after filing the application to pursue such additional claim forms for other aspects of the invention.

We claim:

1. An apparatus for recovering a data signal from a received signal, comprising:

N sampling circuits which each samples the received signal periodically with a unique phase;

a sampling clock generating circuit coupled to the N sampling circuits, wherein the sampling clock generating circuit generates a sampling clock signal with the unique phase for ea of the N sampling circuits;

a clock divider circuit coupled to the sampling clock generating circuit, wherein the clock divider circuit supplies N*X clock signals to the sampling clock generating circuit, the N*X clock signals having N*X unique phases separated by substantially equal phase increments totaling 360 degrees; and a switching signal generating circuit coupled to the N sampling circuits and to the sampling clock generating circuit to, determine whether the N sampling circuits are sufficiently in phase with the received signal; and generate a control signal to shift phases of the N sampling circuits to cause the N sampling circuits to be sufficiently in phase with the received signal, such that an effective sampling resolution is N*X and an actual sampling resolution is N.

2. The apparatus of claim 1, further comprising an analog phase locked loop coupled to the clock divider circuit to supply the clock divider circuit with N clock signals.

3. The apparatus of claim 1, wherein the clock divider circuit comprises a multi-phase interpolator circuit.

4. The apparatus of claim 1, wherein the clock divider circuit comprises multiple delay elements that comprise voltage controlled oscillator cells.

5. The apparatus of claim 1, wherein the clock divider circuit comprises a resistive network.

6. The apparatus of claim 1, wherein the switching signal generation circuit comprises logic that receives samples of the received signal from each of the N sampling circuits, and evaluates the samples as a sequence of ones and zeros to establish one state chosen from a group comprising, the N sampling circuits are sampling too late, the N sampling circuits are sampling too early, and no decision is possible.

7. The apparatus of claim 6, wherein the one state established determines the control signal generated, and wherein there are N*X possible control signals that each cause the sampling clock generating circuit to generate a unique set of N sampling clock signals.

8. The apparatus of claim 1, wherein:

N equals four and X equals four;

the switching signal generating circuit comprises logic that receives samples of the received signal from each of the four sampling circuits, and evaluates the samples as a sequence of ones and zeros to establish one state chosen from a group comprising, the four sampling circuits are sampling too late, the four sampling circuits a sampling too early, and no decision is possible; and the control signal is one of sixteen possible control signals that cause the sampling clock generating circuit to change phases of four sampling clock signals it generates for the four sampling circuits.

9. The apparatus of claim 8, wherein the sampling clock generating circuit comprises a switching matrix that determines which four of sixteen possible clock signals drive the four sampling circuits at one time; and wherein the sampling clock generating circuit further uses one of the four clock signal driving the four sampling circuits to synchronize a switching operation initiated by the control signal, such that the four sampling circuits receive uninterrupted sampling clock signals during the switching operation.

10. The apparatus of claim 8, wherein the switching signal generating circuit receives the four sampling clock signals generated by the sampling clock generating circuit for clocking the logic.

11. A method for converting a received digital-encoded serial signal into digital data comprising:

generating N sampling clock signals with N distinct phases equally distributed about 360 degrees;

dividing each of the N sampling clock signals by X to produce N*X sampling clock signals with N*X distinct phases equally distributed about 360 degrees;

sampling the received signal, including collecting N samples using N sampling circuits, wherein each of the N sampling circuits is clocked by one of N sampling clock signals chosen from among the N*X sampling clock signals, and wherein the N sampling clock signals chosen have distinct phases equally distributed about 360 degrees;

determining whether the N sampling clock signals chosen are synchronized with the received signal so as to sample meaningful data; and if it is determined that the N sampling clock signals chosen are not synchronized, choosing N new sampling clock signals from among the N*X sampling clock signals for clocking the N sampling circuits.

12. The method of claim 11, wherein determining whether the N sampling clock signals chosen are synchronized includes evaluating the N samples collected to determine a relationship between the distinct phases of the N sampling clocks and a signal transition point of the received signal, and wherein when the distinct phases of the N sampling clocks are determined to be too close to the signal transition point, the N new sampling clocks are chosen so that the distinct phases of the N new sampling clocks are farther from the signal transition point.

13. The method of claim 11, wherein when the N equals four and wherein X equals four.

14. The method of claim 11, wherein the N sampling clock signals are not synchronized when the distinct phases of the N sampling clock signals are determined to be too close to a signal transition point of the received signal, and wherein the distinct phases of the N new sampling clock signals are chosen from a group comprising N phases each shifted one phase increment ahead relative to the phases determined to be too close and N phases each shifted one phase increment behind relative to the phases determined to be too close.

15. The method of claim 11, wherein determining whether the N sampling clock signals chosen are synchronized includes determining whether the distinct phases of the N sampling clock signals are too close to a signal transition point of the received signal, and wherein choosing new sampling clock signals includes performing a switching operation that switches from N clock signal sources to N new clock signal sources in a controlled manner such that the N sampling circuits receive uninterrupted sampling clock signals.

16. The method of claim 15, wherein determining includes determining whether the distinct phases of the N sampling clock signals are too far ahead of the received signal or too far behind he received signal, and in response, generating one of a set of control signals to perform the switching operation, wherein the set of control signals includes one control signal for each possible group of N sampling clock signals among the N*X sampling lock signals.

17. The method of claim 16, wherein:
when the distinct phases are too far ahead of the received signal the control signal generated is for a group of N sampling clock signals each at least one phase increment behind the N sampling clock signals determined to be too far ahead; and
when the distinct phases are too far behind the received signal the control signal generated is for a group of N sampling clock signals each at least one phase increment ahead of the N sampling clock signals determined to be too far behind.

18. The method for converting the received digital-encoded serial signal into digital data as in claim 11, the method further comprising:
determining if periodically taken samples correspond to meaningful data;
if at least one of the samples fails to correspond to meaningful data, establishing a new sampling frequency, wherein the new sampling frequency has an altered phase with respect to an established sampling frequency; and
periodically taking two or more samples of the received digitally-encoded serial signal based on the new sampling frequency to oversample the received digitally-encoded serial signal.

19. A system for converting a received digital-encoded serial signal into digital data comprising:
means for generating N sampling clock signals with N distinct phases;
means for dividing each of the N sampling clock signals to produce N*X sampling clock signals with N*X distinct phases;
means for sampling the received signal, including collecting N samples using N sampling circuits, wherein each of the N sampling circuits is clocked by one of the N sampling clock signals chosen from among the N*X sampling clock signals;
means for determining whether the N sampling clock signals chosen are synchronized with the received signal so as to sample meaningful data; and
means for choosing N new sampling clock signals from among the N*X sampling clock signals for clocking the N sampling circuits if the means for determining determines that the N sampling clock signals chosen are not synchronized.

* * * * *

UNITED STATES PATENT AND TRADEMARK OFFICE
CERTIFICATE OF CORRECTION

PATENT NO.    : 6,693,985 B2
DATED         : February 17, 2004
INVENTOR(S)   : Hung Sung Li et al.

It is certified that error appears in the above-identified patent and that said Letters Patent is hereby corrected as shown below:

Column 9,
Line 15, "ea" should be -- each --;
Line 65, "a sampling" should be -- are sampling --;

Column 11,
Line 11, "he" should be -- the --;
Line 15, "lock" should be -- clock --;

Signed and Sealed this

Twenty-ninth Day of June, 2004

JON W. DUDAS
*Acting Director of the United States Patent and Trademark Office*